United States Patent [19]
Tam

[11] Patent Number: 5,910,780
[45] Date of Patent: Jun. 8, 1999

[54] SWITCHED-TRANSCONDUCTANCE MULTIPLEXER CIRCUIT WITH INTEGRATED T-SWITCHES

[75] Inventor: Kimo Y. F. Tam, Arlington, Mass.

[73] Assignee: Analog Devices, Inc., Norwood, Mass.

[21] Appl. No.: 08/747,861

[22] Filed: Nov. 13, 1996

[51] Int. Cl.$^6$ .......................... H04Q 19/00; G06F 13/00; H04N 5/268; H03K 19/094

[52] U.S. Cl. .................... 340/825.79; 395/311; 395/312; 348/705; 326/113; 361/60

[58] Field of Search ............................ 340/825.79, 825.8, 340/826; 395/311, 312; 326/113; 327/94; 348/705; 379/291, 292, 306; 361/60

[56] References Cited

U.S. PATENT DOCUMENTS

| | | | |
|---|---|---|---|
| 4,096,399 | 6/1978 | Davis et al. | 307/249 |
| 4,821,033 | 4/1989 | Mori et al. | 340/825.79 |
| 5,081,453 | 1/1992 | Endoh et al. | 340/825.79 |
| 5,126,734 | 6/1992 | Harrand | 340/825.9 |
| 5,170,335 | 12/1992 | Brokaw | 363/127 |
| 5,179,293 | 1/1993 | Hilton | 307/255 |
| 5,284,047 | 2/1994 | Brokaw | 73/35 |
| 5,289,332 | 2/1994 | Senn et al. | 361/1 |
| 5,389,833 | 2/1995 | Kay | 327/96 |
| 5,532,629 | 7/1996 | Nagaraj | 327/94 |
| 5,598,114 | 1/1997 | Jamshidi | 326/113 |

FOREIGN PATENT DOCUMENTS

| | | | |
|---|---|---|---|
| 405075395 | 3/1993 | Japan | 327/554 |

OTHER PUBLICATIONS

The Monolithic Op Amp: A Tutorial Study, James E. Solomon, IEEE J. Solid-State Circuits, vol. SC-9, pp. 12-30, Dec. 1974.

Analog Devices 250 MHz, 10ns Switching Multiplexers w/Amplifier, AD8170/AD8174, Specification, pp. 1-15.

Analog Devices, 750 MHz, 3.8mA 10ns Switching Multiplexers, AD8180/AD8182, Specification, pp. 1-12.

Analog Devices, 16 X 16 Crosspoint Switch Array, AD75019.

Burr-Brown, MPC102 Wide-Bandwidth Dual 2X 1 Video Multiplexer, pp. 1-16, Nov. 1993.

Gennum Corporation, GY4102 Fast Toggling Video Switch Data Sheet, Feb. 1991 Rev. Jul. 1991.

(List continued on next page.)

*Primary Examiner*—Michael Horabik
*Assistant Examiner*—Anthony A. Asongwed
*Attorney, Agent, or Firm*—Wolf Greenfield & Sacks, P.C.

[57] ABSTRACT

A switched-transconductance circuit used in a multiplexer forming a part of a crosspoint switch includes integrated T-switches that are enabled when the transconductance stage is not enabled. The transconductance stage is selectively enabled by controlling a split-tail current source driving a differential pair of input transistors. When the transconductance stage is disabled (1) a pair of switches connected between the collectors of the differential pair and a positive voltage supply node are enabled, (2) a pair of cascode transistors connected between the collectors of the differential pair and output leads of the circuit are reversed biased by the positive supply voltage passing through the pair of switches, and (3) a switch is enabled between a common emitter node of the differential pair and a low impedance constant voltage node. In this manner, a pair of common collector T-switches and an emitter T-switch are formed, respectively, between the inputs and output and between the differential inputs of the transconductance stage when the transconductance stage is disabled. When the transconductance stage is enabled, the emitter T-switch is disabled and an additional current source, controlled by the same control signal that controls the split-tail current source, drives a current through a resistor to create a voltage that disables the pair of switches. The disabling of the switches disallows the positive voltage from passing therethrough, thereby forward biasing the cascode transistors. In this state, the collector and emitter T-switches are disabled and the circuit functions as an ordinary differential transconductance circuit.

39 Claims, 4 Drawing Sheets

OTHER PUBLICATIONS

Linear Technology, 150 MHz Video Multiplexers, LT1203/LT1205, pp. 1–16.

Maxim Engineering Journal, New IC s Boost Video Performance, vol. 17.

Siliconix, Truth Tables and Ordering Information DG535/536, P–32167, Rev. Nov. 15, 1993.

Siliconix, 4–/8–Channel Wideband Video Multiplexers, DG534A/538A, P–32167, Rev. Nov. 15, 1993.

SWITCHED-TRANSCONDUCTANCE MULTIPLEXER CIRCUIT WITH INTEGRATED T-SWITCHES

BACKGROUND OF THE INVENTION

1. Field of the Invention

The present invention relates to crosspoint switching of electronic signals and, more particularly, to a switched-transconductance circuit having integrated T-switches for use in a crosspoint switch.

2. Discussion of Related Art

Figure 1:
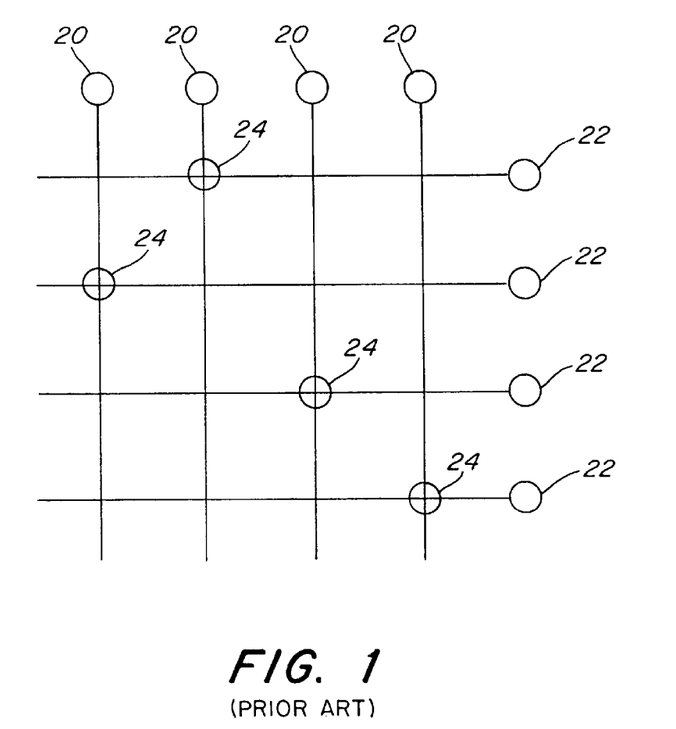
FIG. 1 shows an example of basic prior art crosspoint switch.

A simple crosspoint having four inputs and four output channels (i.e., a 4×4 crosspoint) is shown in FIG. 1. Each input 20 receives an input signal (e.g., an audio, video or other electronic signal) and each output 22 provides an output signal. The making or breaking of each crosspoint connection 24, determines the content of the output signals at each of outputs 22. Such a crosspoint could be used, for example, to switch video signals into a computer or otherwise to permit the selection of outputs from a variety of different input sources, e.g., video from cable sources or audio from tape decks, receivers or compact disc players. Since each output 22 typically is driven by only one input 20, each output 22 of the crosspoint of FIG. 1 could be considered to be an output of a four-to-one (4:1) multiplexer. In fact, a common method of implementing an n-by-m (n×m) crosspoint is to interconnect "n" corresponding inputs of "m" n-to-1 (n:1) multiplexers.

It typically is desirable for the connections, e.g., connections 24 in FIG. 1, to be made or broken at high speeds, thereby necessitating purely electronic (as opposed to electromechanical) switching at each of the connections. Thus, prior art crosspoints have employed transistors as switches at each connection of a crosspoint. Parasitic capacitances of simple transistor switches, however, may allow high frequency input signals to pass through to unselected outputs. This phenomenon is known as "crosstalk" between channels.

Figure 2:
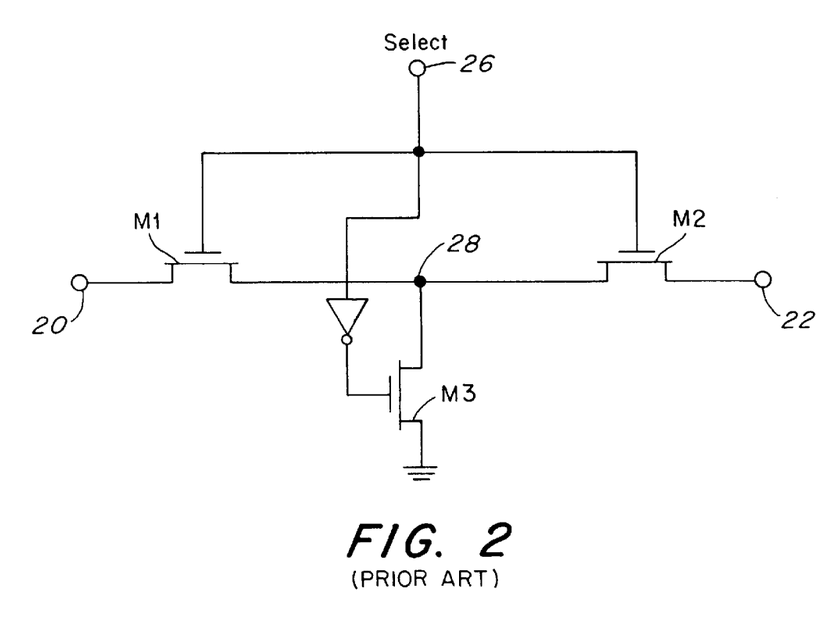
FIG. 2 shows a schematic of a basic prior art T-switch.

One circuit employed to reduce crosstalk between an input to and an output from a switch is shown in FIG. 2. This circuit commonly is referred to as a "T-switch." As shown, the T-switch has an input 20 to receive an input signal and an output 22 to provide an output signal. Input 20 and output 22 could correspond, respectively, for example, to one of the inputs and one of the outputs of the crosspoint shown in FIG. 1.

Select line 26 activates or deactivates the T-switch. When select line 26 is high, transistors M1 and M2 are turned on and transistor M3 is turned off. Hence, when select line 26 is high, i.e., has a voltage thereon that is above a predetermined threshold voltage (e.g., three volts), the T-switch is activated since a low impedance path, i.e., including only to the "on" resistance of transistors M1 and M2 in series, is provided (via transistors M1 and M2) between input 20 and output 22, thereby permitting a signal at input 20 to be provided at output 22. Conversely, when select line 26 is low, i.e., has a voltage thereon that is below a predetermined threshold voltage (e.g., three volts), transistors M1 and M2 are turned off and transistor M3 is turned on. Thus, when select line 26 is low, the T-switch is deactivated since the impedance of the path from input 20 to output 22 is very high in this state, i.e., the impedance is equal to the "off" impedance of transistors M1 and M2 in series.

When the T-switch is deactivated, however, although the parasitic capacitances of transistors M1 and M2 are present (permitting high frequency input signals, e.g., greater than one megahertz (MHZ), to reach node 28 of the T-switch), transistor M3 provides a low impedance path from node 28 to ground node GND, i.e., a constant voltage node. Therefore, when the T-switch is deactivated, much of the unselected input signal that normally would pass through to the output (resulting in crosstalk between the unselected input and the output) is shunted from node 28 to ground. The transfer function of such a T-switch is that of a two-pole high pass filter, as compared to the single pole (high-pass) transfer function of a more simple single transistor switch. The filtering provided by a T-switch configuration therefore may significantly improve the low frequency isolation between the inputs and outputs of a crosspoint in which such T-switches are employed.

Such a T-switch implementation of a crosspoint results in negligible static power dissipation (limited by transistor leakage), zero offset between the input and output, and a large input signal range, i.e., approximately one transistor threshold voltage (Vt) above and below, respectively, the low and high power supply voltage rails of the circuit. Since the T-switch is bidirectional (due to its symmetry), however, the input source is directly coupled to the output load when the T-switch is activated. Because the inputs are directly coupled to the outputs, the number of outputs to which an input may be fanned out is limited, especially if the output loads are resistive. In addition, the bidirectional nature of T-switches typically necessitates a break-before-make switching sequence so as to avoid the momentary shorting of input sources together when switching channels.

When metal oxide semiconductor (MOS) transistors are used in T-switches, the pass transistors, e.g., transistors M1 and M2 in FIG. 2, can introduce significant distortion in the transfer function between an input and an output. This distortion results because the "on" resistance of an MOS transistor varies with the gate-to-source voltage (Vgs) and the drain-to-source voltage (Vds) of the transistor. In a CMOS process, this variation in "on" resistance can be reduced by placing an n-channel device in parallel with a p-channel device and driving the gates of the parallel devices with complementary control signals. Nevertheless, very large devices typically are required to achieve a sufficiently low "on" resistance of the pass transistors. The use of large MOS devices, however, results in a large input capacitance change between the "on" and "off" states of the T-switch, a large disabled output capacitance of the T-switch, and a substantial charge injection when an output of a crosspoint switches channels. These characteristics limit the fan-in of a crosspoint, i.e., the number of inputs that may be multiplexed into each output of the crosspoint, and may cause distortion and/or noise glitches at the outputs thereof.

Another option for implementing an n:1 multiplexer (for use in an n:m crosspoint) is to selectively enable one of a group of "n" amplifiers (or buffers), with outputs of all "n" amplifiers being connected together and each amplifier receiving a separate input signal. Each of the switched amplifiers in such a configuration thus behaves as a unilateral switch. Since only one amplifier (in each n:1 multiplexer) is on at any one time, power consumption will be minimized in a crosspoint using such switched amplifiers.

If closed-loop "switched" amplifiers are used as unilateral switches, such switches will have a high input impedance and a low on-state output impedance. Because individual closed-loop amplifiers typically are die area intensive, however, the number of closed-loop amplifiers that may be used to implement a switched amplifier multiplexer may be restricted due to die "real estate" concerns. Additionally, the output capacitances of closed-loop amplifiers (in their disabled state) typically are large due to the large output devices employed by the amplifiers. The resulting capacitive loading at the output of any given amplifier thereby places limits on the bandwidth and fan-in of the n:1 multiplexer. Also, the switching time and glitch of an n:1 multiplexer using closed-loop amplifiers are compromised by the large number of devices that must change state when a particular amplifier is enabled or disabled.

If "switched" open-loop buffers are used (instead of closed-loop amplifiers), the resulting unilateral switches also will have a high input impedance and a relatively low output impedance (typically tens of ohms). In contrast with switched closed-loop amplifiers, open-loop buffers are compact (i.e., consume a minimal amount of real estate) and have a low output capacitance when disabled, thereby increasing the fan-in capability of the n:1 multiplexer. Further, relatively "compact" open-loop buffer multiplexers do not suffer from the aforementioned switching time and glitch problems (encountered with switched closed-loop amplifier multiplexers). Disadvantages occur, however, due to the open-loop nature of the buffers. Although the distortion caused by the non-zero output resistance of an open-loop buffer is tolerable when the buffer is driving only a moderate load, when directly driving a video load, a prohibitively high quiescent current would be required to attain low distortion. Although such a gain error problem could be remedied by buffering the output of the open-loop buffer multiplexer with a closed-loop amplifier, such an approach would result in a topology that is more area intensive and less power efficient than even a switched-amplifier approach.

Figure 3:
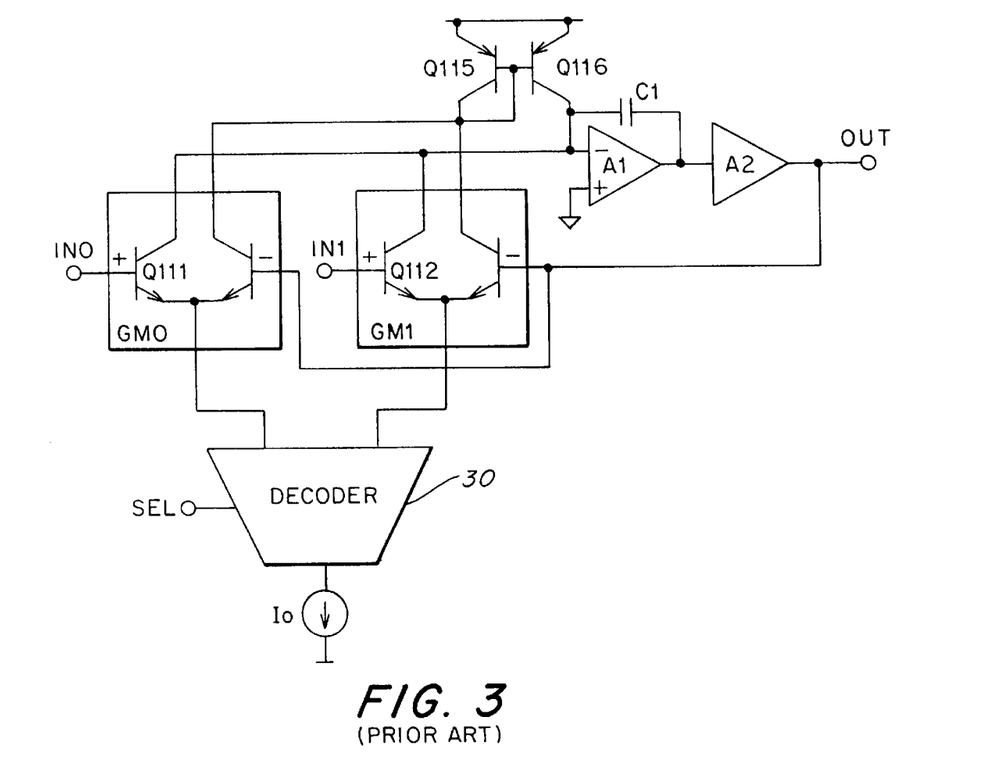
FIG. 3 shows a partial schematic/partial block diagram of a prior art switched-transconductance multiplexer circuit.

Yet another circuit that can be used to select a single output from a plurality of inputs (i.e., a multiplexer), is a switched-transconductance multiplexer. An example of a switched-transconductance 2:1 multiplexer (configured for unity gain) is shown in FIG. 3. As shown, decoder 30, responsive to a select signal, steers a fixed-tail current to one of two transconductance stages (i.e., either transconductance stage GM0 or transconductance stage GM1), thereby enabling the stage receiving the tail current. The output of the selected transconductance stage is a differential current which, in this example, is converted into a single-ended current by a current mirror comprised of transistors Q115 and Q116 and integrated by capacitor C1 and high-gain amplifier A1. The output of amplifier A1 is buffered by unity gain buffer A2 and fed back to the inverting inputs of both transconductance stages. The high loop-gain of such a switched-transconductance circuit minimizes the error between the selected input and the output.

The switched-transconductance multiplexer topology (such as that shown in FIG. 3) offers several of the advantages offered by switched amplifier multiplexers, i.e., high input impedance, low output impedance, low distortion, high output-drive capability and selectable gain. Additionally, in contrast to the switched amplifier topology, the disabled output capacitance of a switched-transconductance multiplexer also is low (since the multiplexing function is accomplished internally) and only the input stages are replicated, thereby increasing the compactness of the multiplexer. Also, since changing the selected input involves the switching of only a few input devices, switching times are reduced and smaller glitches are encountered than with a switched amplifier architecture. Further, since only one of the transconductance stages is enabled at any given time, the power dissipation of the circuit is little more than that of a single amplifier.

Ideally, signals applied to the inputs of unselected transconductance stages in a switched-transconductance multiplexer would not influence the output of the multiplexer. Parasitic capacitances, however, caused by the wiring of the circuit and the reverse biased junctions of the input transistors in the unselected stages (e.g., transistors Q111 and Q112 in FIG. 3) tend to act as high-pass conduction paths between the unselected inputs and the output of the multiplexer. Although the parasitic capacitance caused by the circuit's wiring may be reduced by optimizing the circuit layout, at high frequencies, the parasitic capacitances of the input transistors in the unselected transconductance stages may still permit undesirable crosstalk between the unselected inputs and the selected input (i.e., crosstalk between channels) which, in turn, places an upper limit on the bandwidth of the switched-transconductance multiplexer.

Figure 4:
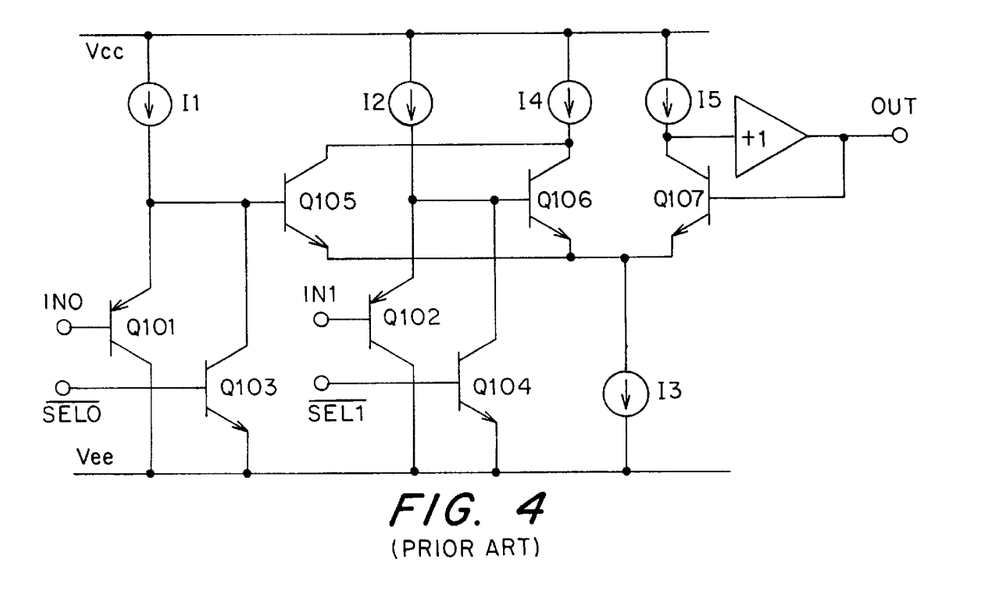
FIG. 4 shows a partial schematic/partial block diagram of a prior art transconductance circuit that employs an integrated input T-switch.

One circuit designed to reduce the crosstalk between unselected and selected channels in a multiplexer (caused by the parasitic capacitances of input transistors in the unselected transconductance stages) is shown in FIG. 4. As shown, each of transistors Q105 and Q106 comprise one half of a differential pair of input transistors, while both of transistors Q105 and Q106 share transistor Q107 as the second half of each of the respective differential pairs. The signals on each of select lines $\overline{SEL0}$ and $\overline{SEL1}$ determines which, if either, of transistors Q105 and Q106 is enabled at any given time. That is, if either of select lines $\overline{SEL0}$ and $\overline{SEL1}$ is asserted (i.e., a logic high signal is placed thereon), then the transistor(s) receiving the logic high signal (i.e., transistor Q103 and/or Q104) will be turned on. If transistor Q103 is turned on, then the biasing current from current source I1 will be steered away from the emitter of transistor Q101, thereby reverse biasing transistors Q101 and Q105. Similarly, if transistor Q104 is turned on, then the biasing current from current source I2 will be steered away from the emitter of transistor Q102, thereby reverse biasing transistors Q102 and Q106. If either of transistors Q103 or Q104 is not turned on, however, then a second half of the differential pair of input transistors (i.e., transistor Q105 or Q106, respectively) will be enabled and an input signal at the base of the emitter follower connected thereto (i.e., transistor Q101 or Q102, respectively) will be processed by the differential pair.

When a particular input is not selected, a corresponding one of transistors Q103 and Q104 will provide a low impedance path from the base of the non-selected one of the differential pair of input transistors to ground. The resulting T-switch-like structure has the advantage of bypassing both the emitter-base and collector-base capacitances of the non-selected input transistor. The presence of emitter followers Q101 and Q102, however, increases the power consumption of the circuit since they must be provided with high bias currents (from current sources I1 and I2, respectively). Additionally, since the biasing currents from current sources I1 and I2 are steered through transistors Q103 and Q104, respectively, when their associated input stage is disabled, these currents are wasted, i.e., they consume power unnecessarily. Moreover, the input followers (i.e., transistors Q101 and Q102) cause an uncompensated voltage offset (i.e., approximately one base-to-emitter voltage drop (Vbe)) to appear between the differential inputs of the circuit and may increase noise and/or decrease the bandwidth of the circuit. Although the voltage offset could be compensated by including a feedback follower in the circuit, such an addition would further increase the power dissipation of the circuit.

It therefore is a general aim of the invention to provide a high-isolation switched transconductance circuit that consumes less power than prior art circuits. It is an additional aim of the invention to provide a switched-transconductance circuit with improved off-state isolation that does not cause a significant voltage offset to appear between the differential inputs of the circuit.

SUMMARY OF THE INVENTION

According to one aspect of the invention, a switched-transconductance circuit and a method for using the circuit are disclosed. A transconductance stage of the switched-transconductance circuit includes an input to receive an input voltage and an output node to provide an output current that is proportional to the input voltage. The transconductance stage further includes a biasing device (producing a biasing current) arranged to selectively enable (at least partially) the transconductance stage, and a switch coupled between the output node of the transconductance stage and a constant voltage node. The biasing device does not produce a biasing current when the transconductance stage is not enabled.

According to another aspect of the invention, another switch is coupled between the output node of the transconductance stage and an output lead thereof. This switch is arranged to be enabled to allow the output current to pass therethrough only when the transconductance stage is enabled.

According to another aspect of the invention, another switched transconductance circuit and method for using the circuit are disclosed. The switched transconductance circuit includes a transconductance stage including a differential pair of input transistors having current electrodes that are coupled to a common node. An input lead and an output node are coupled to the differential pair to, respectively, receive an input voltage and provide an output current that is proportional to the input voltage. In addition to including a biasing device (producing a biasing current) to selectively (at least partially) enable the transconductance stage, the transconductance stage includes a switch coupled between the common node of the differential pair and a common voltage node.

According to yet another aspect, a transconductance circuit includes a differential pair of input transistors having respective current electrodes coupled to a common node. The transconductance circuit further includes an input lead to receive an input voltage and a pair of output nodes to provide an output current therebetween having an amplitude that is proportional to an amplitude of the input voltage. The transconductance circuit according to this aspect also includes a pair of switches, wherein one switch is coupled between each of the output nodes and a constant voltage node.

According to yet another aspect, a transconductance stage of a switched transconductance circuit includes an input lead to receive an input voltage and an output node to provide an output current having an amplitude that is proportional to an amplitude of the input voltage. Additionally, a switch is coupled between an output node of the transconductance stage and a constant voltage node that is activated in a manner that does not cause any transistors to saturate.

DETAILED DESCRIPTION OF THE INVENTION

According to the invention, a switched-transconductance sub-circuit is disclosed that is designed to maximize the "off" isolation of a multiplexer while minimizing the power consumption, area requirements, and the number of bias and control lines of the multiplexer. Additionally, the sub-circuit provides for fast, low-glitch switching between channels of a multiplexer. To achieve these results, the switched-transconductance circuit according to the invention includes integrated T-switches (to improve the "off" isolation of the multiplexer) which are controlled in concert with a differential pair of input transistors in the transconductance stage.

Figure 5:
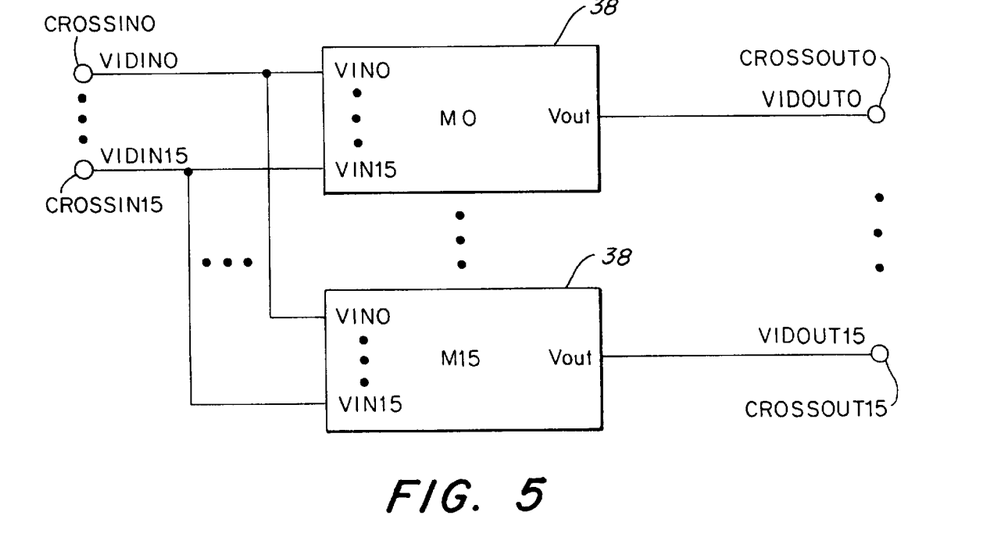
FIG. 5 shows a block diagram of a crosspoint switch implemented according to the invention.

FIG. 5 is a general depiction of a crosspoint having sixteen inputs, i.e., CROSSIN0–CROSSIN15, and sixteen outputs, i.e., CROSSOUT0–CROSSOUT15. Each of the sixteen outputs may be selected from any of the sixteen inputs. Although FIG. 5 represents the inputs and outputs as being video signals, any electronic signals could likewise be processed by a crosspoint according to the invention. As shown, each of multiplexers M0–M15 (identified by reference number 38) shares the same sixteen input signals, e.g., video signals VIDIN0–VIDIN15, with all of the other multiplexers in the crosspoint. Each of these multiplexers receives these shared input signals at its sixteen respective inputs VIN0–VIN15, and provides a single output signal, selected from one of the input signals, at its output lead VOUT. Hence, each of multiplexers M0–M15 provides a distinct crosspoint output signal, e.g., VIDOUT0–VIDOUT15, at its output lead VOUT, which is selected from one of the crosspoint input signals, e.g., VIDIN0–VIDIN15.

Figure 6:
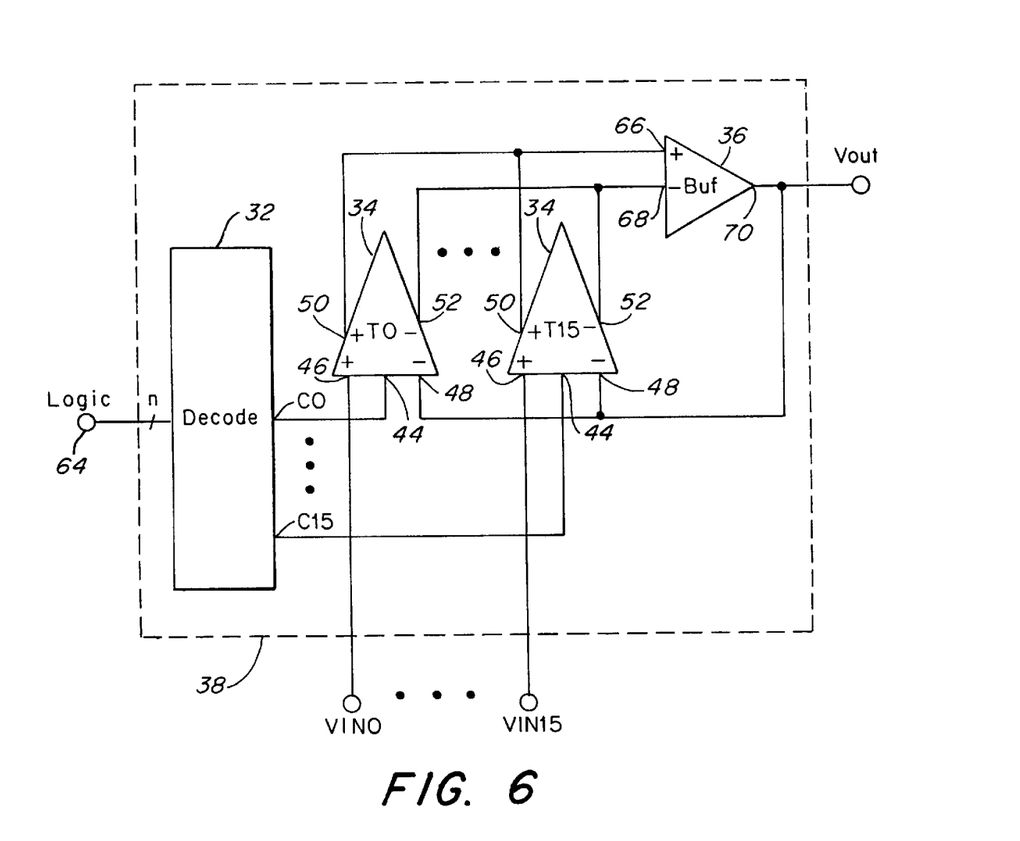
FIG. 6 shows a block diagram of a multiplexer circuit included in the crosspoint switch shown in FIG. 5.

FIG. 6 shows the internal structure of one of the multiplexers 38 (i.e., multiplexers M0–M15 shown in FIG. 5). As shown, each multiplexer 38 includes a decode circuit 32 that receives an n-bit logic signal at input 64. Responsive to this n-bit logic signal, decode circuit 32 provides a current at one of control outputs C0–C15. Such a decoder circuit may be implemented, for example, by using a "tree" of current switches to steer a current to a desired branch of the tree, i.e., one of the control outputs. Each of these control outputs is connected to a respective control input 44 of one of transconductance stages T0–T15 (identified by reference number 34).

Each transconductance stage 34 includes a non-inverting (voltage) input 46, an inverting (voltage) input 48, a positive (current) output 50 and a negative (current) output 52. The non-inverting input 46 of each transconductance stage 34 is connected to a respective one of multiplexer inputs VIN0–VIN15 so as to receive one of sixteen input signals, e.g., VIDIN0–VIDIN15 (shown in FIG. 5). Positive outputs 50 of all of the transconductance stages 34, i.e., transconductance stages T0–T15 if FIG. 6, are interconnected and fed to the non-inverting (current) input 66 of transimpedance buffer 36. Similarly, negative outputs 52 of the transconductance stages are interconnected and fed to the inverting (current) input 68 of transimpedance buffer 36. An output voltage from output 70 of buffer 36 is fed back to the non-inverting input 48 of each of transconductance stages 34, i.e., transconductance stages T0–T15, and also is provided at output node VOUT of multiplexer 38.

Figure 7:
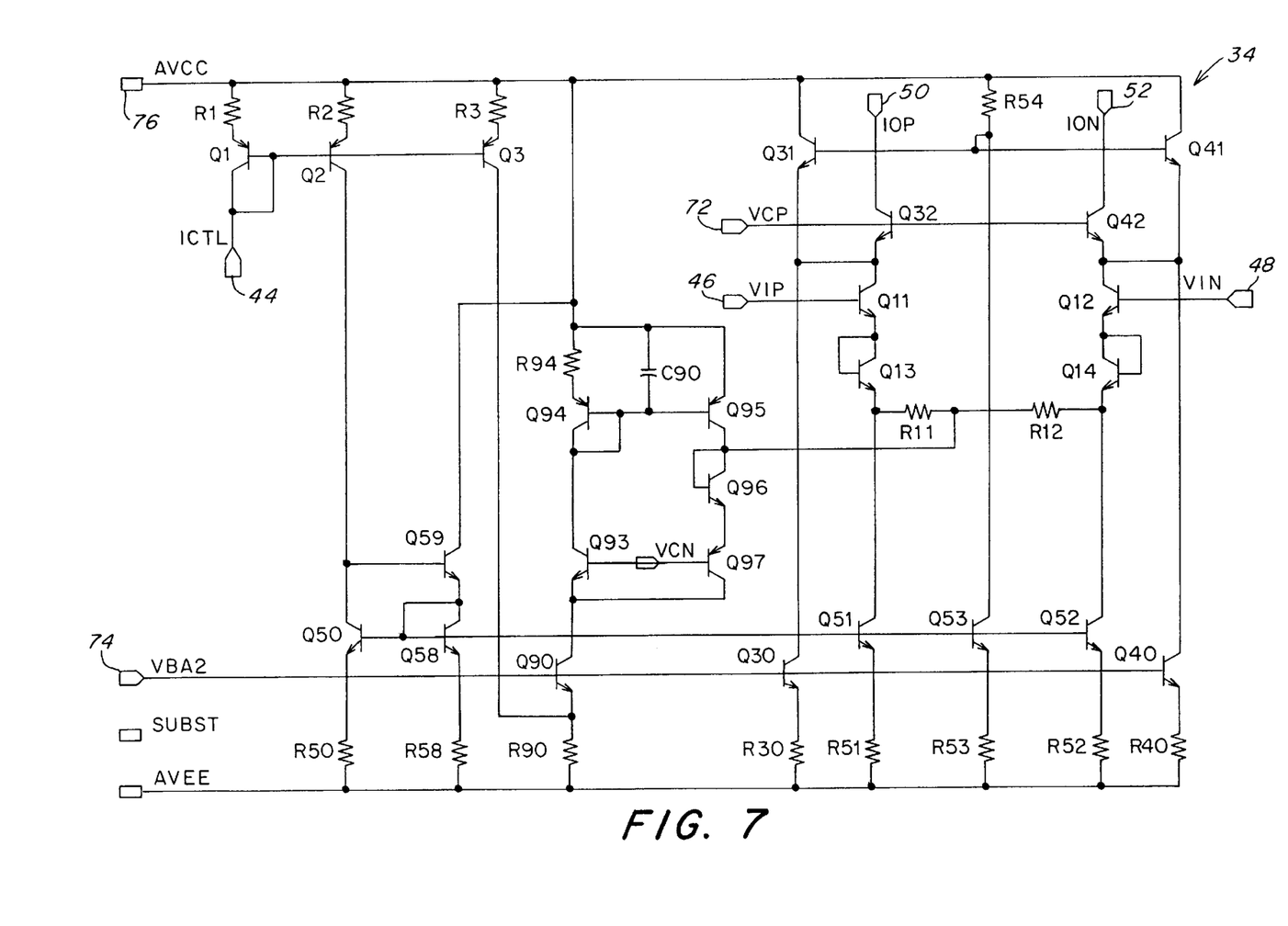
FIG. 7 shows a schematic diagram of a switched-transconductance stage included in the multiplexer circuit shown in FIG. 6.

FIG. 7 shows a schematic diagram of one of transconductance stages 34 (i.e., one of transconductance stages T0–T15 in FIG. 6). As shown, the bases of a differential pair of input transistors Q11 and Q12 are connected, respectively, to non-inverting input lead 46 and inverting input lead 48 of transconductance stage 34. An input voltage, e.g., one of video input signals VIDIN0–VIDIN15, is provided at non-inverting input lead 46, while inverting input lead 48 is connected to the voltage output of a buffer driven by the transconductance stage 34. The differential pair of input transistors Q11 and Q12 is driven by a split-tail current source comprising current source transistors Q51 and Q52 (which are biased by resistors R51 and R52, respectively). Diode connected transistors Q13 and Q14 are connected between the emitters of transistors Q11 and Q12 and the collectors of current source transistors Q51 and Q52, respectively. These diodes, i.e., diode connected transistors Q13 and Q14, are included to augment the differential pair of input transistors Q11 and Q12 so as to help prevent the breakdown of the input transistors when the transconductance stage is disabled. Degeneration resistors R11 and R12 are connected in series between the collectors of current source transistors Q51 and Q52. The inclusion of degeneration resistors R11 and R12 improves the linearity of the transconductance stage.

Transconductance stage 34 is enabled when control current ICTL is injected at control input 44. When injected, control current ICTL is amplified by a simple PNP current mirror comprising transistors Q1 and Q2 (which are biased by resistors R1 and R2, respectively). The output of this simple PNP current mirror then is fed to a base current corrected current mirror comprising transistors Q50, Q58 and Q59 (which is biased by resistors R50 and R58). This base current corrected current mirror drives the split tail current source (including transistors Q51 and Q52) as well as current source transistor Q53.

Resistor R54 is connected between positive voltage supply 76 and the collector of current source transistor Q53. Switching transistors Q31 and Q41 have their collectors connected to positive voltage supply 76, their bases connected to the collector of current source transistor Q53, and their emitters connected to the collectors of the differential input transistors Q11 and Q12, respectively. The collectors of constant "trickle" current source transistors Q30 and Q40 (biased by resistors R30 and R40, respectively, and controlled by the voltage VBA2 at bias node 74) are connected to the emitters of switching transistors Q31 and Q41, respectively, thereby reducing the emitter resistance of the switching transistors.

Cascode transistors Q32 and Q42 are connected, respectively, between the collectors of the differential input transistors Q11 and Q12 and output leads 50 and 52 of the transconductance stage. The bias voltage VCP applied to bias node 72 is maintained at approximately one base-to-emitter voltage drop (Vbe) below the voltage AVCC at positive voltage supply 76, thereby maximizing the input signal swing headroom of the transconductance stage. Despite the presence of these cascode transistors, however, the collectors of transistors Q11 and Q12 can be considered to be output nodes of transconductance stage 34 since, when the stage is enabled, the current provided at these nodes is proportional to the voltage provided at input leads 46 and 48.

When transconductance stage 34 is enabled, current source Q53 is turned on concurrently with current sources Q51 and Q52. The turning on of current sources Q51 and Q52 serves to enable the transconductance stage since these current sources are required to drive the differential pair of input transistors Q11 and Q12. Additionally, when current source Q53 turns on, the current through resistor R54 will cause the bases of transistors Q31 and Q41 to be pulled low, i.e., turned off. The turning off of transistors Q31 and Q41 steers the collector currents of differential input transistors Q11 and Q12 to the emitters of cascode transistors Q32 and Q42, respectively. Since the bases of cascode transistors Q32 and Q42 are kept at one Vbe drop below AVCC, the collector currents of differential input transistors Q11 and Q12 will be permitted to flow through the cascode transistors unless (or until) the input signal is so high that the cascode transistors are no longer forward biased.

Further, when control current ICTL is injected into control node 44, a simple PNP current mirror (comprising transistors Q1 and Q3) amplifies the control current and injects the amplified control current into a junction formed between the emitter of current source transistor Q90 and its biasing resistor R90. This injection of current causes current source Q90 to turn off, thereby disabling a fast emitter T-switch (comprising transistors Q93–Q97, resistor R94 and capacitor C90). Thus, in the enabled mode, transconductance stage 34 behaves as a conventional differential pair with a split-tail current source.

When the control current ICTL is removed from control node 44, the enabling current no longer is generated by the simple PNP current mirror (comprising transistors Q1 and Q2), the base current corrected NPN mirror (comprising transistors Q50, Q58 and Q59) and current sources Q51, Q52 and Q53. The turning off of current sources Q51 and Q52 disables the transconductance stage, while the turning off of current source Q53 enables a pair of collector T-switches integrated with the differential pair of input transistors Q11 and Q12. That is, when current source Q53 is turned off, no current passes through resistor R54, thereby causing the voltage at the bases of switching transistors Q31 and Q41 to be pulled high (i.e., pulled to AVCC). This pulling high of the bases of switching transistors Q31 and Q41 causes these transistors to turn on, thereby causing the voltage at the emitters of transistors Q31 and Q41 (and at the emitters of cascode transistors Q32 and Q42) to be pulled high.

Thus, the turning on of switching transistors causes: (1) a low impedance path to be established between the collectors of the differential input transistors Q11 and Q12 and positive voltage supply 76, and (2) cascode transistors Q32 and Q42 to be reverse biased, i.e., turned off. These two results, in combination with the disabling of the differential pair of input transistors Q11 and Q12, increases the isolation between input leads 46 and 48 and output leads 50 and 52, respectively, due to the effective T-switch established between these points. That is, when the circuit is in its disabled state, signals presented at input nodes 46 or 48, which normally would pass though the parasitic base-to-collector capacitances of the differential pair of input transistors Q11 or Q12, would be shunted to positive supply node 76 via switching transistors Q31 or Q41, as well as being blocked by (reversed biased) cascode transistors Q31 and Q41, respectively. The trickle currents supplied by current sources Q30 and Q40 raise the corner frequency of the high-pass T network by reducing the emitter resistances of switching transistors Q31 and Q32.

When used in a multiplexer circuit (such as that shown in FIG. 6), non-inverting input 48 of transconductance stage 34 will be connected to the output of transimpedance buffer 36. Therefore, hostile inputs will be applied only to the base of input transistor Q11 (rather than to both of transistors Q11 and Q12) and a T-switch is not required at the collector of transistor Q12 for crosstalk rejection purposes. Nevertheless, the symmetrical arrangement employed in transconductance stage 34 reduces the switching transient caused by the collector T-switches.

Additionally, to prevent unwanted crosstalk between non-inverting input lead 46 and inverting input lead 48 (which is connected to the output of the multiplexer) via the emitter-base capacitances of transistors Q11, Q13, Q14 and Q12, a fast emitter T-switch (comprising transistors Q93–Q97, resistor R94 and capacitor C90) is enabled when transconductance stage 34 is disabled. The fast emitter T-switch pulls the common emitter node (i.e., the common current electrode node of the differential pair of input transistors Q11 and Q12 or the node between degeneration resistors R11 and R12) up to approximately three volts. When activated, this emitter clamp circuit initially supplies a large current pulse to quickly pull up the common-emitter node, and then switches to a low-current mode in which the node is clamped by a low impedance. This clamping results in a T-switch structure being formed between non-inverting input 46 and inverting input 48 of transconductance stage 34, thereby raising the corner frequency of the high pass network formed between these inputs.

It should be understood that while the switched-transconductance described herein employs bipolar junction transistors (BJTs), the circuit could equivalently be implemented using metal oxide semiconductor (MOS) or any other transistor type without departing from the intended scope of the invention. In addition, while the switched-transconductance stage described herein is implemented with a differential pair of input transistors driven by a controllable current source, the scope of the invention is not limited to such an implementation, as any "switchable" transconductance stage could equivalently be used. Further, while the example described uses a controllable current source and a resistor as a circuit to control the emitter T-switches of the differential pair of input transistors, any "switch control" circuit performing a similar function may equivalently be employed, also without departing from the scope of the invention.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit, comprising:
  at least one transconductance stage including:
    at least one input node to receive an input voltage;
    at least one output node to provide an output current having an amplitude that is proportional to an amplitude of the input voltage;
    a transconductance element that receives the input voltage from the at least one input node, receives a biasing current to at least partially enable the transconductance element and, when enabled, provides the output current to at least one circuit node of the transconductance element;
    at least one biasing device to selectively provide the biasing current to the transconductance element, the at least one biasing device being in an off state when the transconductance element is not enabled;
    at least one first switch coupled between the at least one circuit node and the at least one output node such that activation of the at least one first switch when the transconductance element is enabled permits the output current to flow between the at least one circuit node and the at least one output node; and
    at least one second switch coupled between the at least one circuit node and a constant voltage node such that activation of the at least one second switch when the transconductance element is not enabled, regardless of a state of the at least one first switch, causes the at least one circuit node to be coupled to the constant voltage node.

2. The circuit as claimed in claim 1, wherein the at least one first switch is activated to allow the output current to pass therethrough only when the transconductance element is enabled.

3. The circuit as claimed in claim 1, wherein a single control signal controls the at least one biasing device, the at least one first switch, and the at least one second switch.

4. The circuit as claimed in claim 1, wherein:
  the transconductance element includes a differential pair of input transistors; and
  the at least one biasing device is arranged to selectively drive the differential pair of input transistors.

5. The circuit as claimed in claim 4, wherein:
  the at least one circuit node of the transconductance element includes a current electrode of one of the differential pair of input transistors; and
  the at least one first switch includes a cascode transistor coupled between the current electrode and the at least one output node, the cascode transistor being biased so as to permit the output current to flow between the current electrode and the at least one output node only when the transconductance element is enabled.

6. The circuit as claimed in claim 4, further comprising a diode coupled between a current electrode of the one of the differential pair of input transistors that is opposite the current electrode thereof to which the at least one first switch is coupled and the at least one biasing device.

7. The switched-transconductance circuit as claimed in claim 6, wherein the at least one biasing device includes a pair of current sources forming a spit-tail current source to drive the differential pair of input transistors.

8. The switched-transconductance circuit as claimed in claim 7, further comprising a pair of degeneration resistors coupled in series between the pair of current sources.

9. The circuit as claimed in claim 8, further comprising a third switch coupled between a junction point of the pair of degeneration resistors and a constant voltage node such that activation of the third switch causes the junction point to be coupled to the constant voltage node, the third switch being activated when the transconductance element is not enabled.

10. The circuit as claimed in claim 4, further comprising a third switch coupled between a common node of the differential pair of input transistors and a constant voltage node such that activation of the third switch causes the common node to be coupled to the constant voltage node, the third switch being activated when the transconductance element is not enabled.

11. The circuit as claimed in claim 1, wherein the at least one second switch comprises a bipolar junction transistor (BJT) and the circuit further comprises at least one current source coupled to the BJT to reduce a resistance thereof.

12. The circuit as claimed in claim 1, further comprising a switch control circuit coupled to the at least one second switch, the switch control circuit including a switch control current source controlled by a control signal that also controls the at least one biasing device, whereby the switch control circuit causes the at least one second switch to be activated when the transconductance element is not enabled.

13. The switched-transconductance circuit as claimed in claim 1, wherein the at least one biasing device is controlled by a control current provided at a control lead, and the switched-transconductance circuit further comprises at least one current mirror coupled between the control lead and the at least one biasing device.

14. The switched-transconductance circuit as claimed in claim 1, further comprising a decode circuit having a plurality of inputs and a plurality of control outputs, one of the plurality of control outputs of the decode circuit being coupled to a control lead of the switched-transconductance circuit to provide the control lead with a particular control signal that controls the at least one biasing device, the decode circuit being configured to provide an activating control signal on less than all of the control outputs thereof.

15. The circuit as claimed in claim 1, further comprising a buffer coupled to the at least one output node so as to be driven by the output current provided by the at least one output node.

16. The circuit as claimed in claim 15, wherein:
the buffer includes a transimpedance buffer,
the at least one input node includes a pair of input nodes, and
an output of the transimpedance buffer is coupled to one of the pair of input nodes that does not receive the input voltage.

17. The circuit as cl aimed in claim 1, wherein:
the at least one transconductance stage is included in a multiplexer circuit comprising a plurality of transconductance stages,
each of the plurality of transconductance stages in the multiplexer circuit receives a separate input voltage and produces a respective output current, and
each of the plurality of transconductance stages is selectively enabled such that less than all of the plurality of transconductance stages are enabled at one time.

18. The circuit as claimed in claim 17, further comprising a buffer coupled to the plurality of transconductance stages so as to be driven by output currents provided by output nodes of enabled ones of the plurality of transconductance stages.

19. The circuit as claimed in claim 18, wherein:
the buffer comprises a transimpedance buffer,
each of the plurality of transconductance stages includes a pair of input nodes to receive a respective input voltage thereon, and
an output of the transimpedance buffer is coupled to one of each of the pairs of input nodes of the plurality of transconductance stages.

20. The circuit as claimed in claim 17, further comprising a decode circuit having a plurality of inputs and a plurality of control outputs, one of the plurality of control outputs of the decode circuit being coupled to a respective control node of each of the plurality of transconductance stages to provide each control node with a respective control signal to enable that transconductance stage, the decode circuit being providing an activating control signal on less than all of the control outputs thereof.

21. The circuit as claimed in claim 17, wherein the multiplexer circuit is included in a crosspoint comprising a plurality of similar multiplexer circuits, each multiplexer circuit in the crosspoint sharing a plurality of respective input nodes with each of the other multiplexer circuits in the crosspoint.

22. The circuit as claimed in claim 1, wherein:
the at least one input node includes a pair of input nodes to receive a differential input voltage thereacross,
the at least one output node includes a pair of output nodes to provide a differential output current therebetween that is proportional to the differential input voltage, and
the transconductance element produces the differential output current such that an amplitude of the differential output current is negligible when a negligible differential voltage is applied across the pair of input nodes.

23. A switched-transconductance circuit, comprising:
at least one transconductance stage, which is powered from a voltage provided between a first supply node and a second supply node, including:
a differential pair of input transistors having respective current electrodes coupled to a common node,
at least one input node coupled to one of the differential pair of input transistors to receive an input voltage thereon;
at least one output node coupled to one of the differential pair of input transistors to provide an output current having an amplitude that is proportional to an amplitude of the input voltage;
at least one biasing device, coupled to each of the common node and the first supply node, to selectively provide a biasing a current that at least partially enables the at least one transconductance stage, the at least one biasing device being in an off state when the at least one transconductance stage is not enabled; and
a switch coupled between the common node and a constant voltage node other than the first supply node such that activation of the switch causes the common node to be coupled to the constant voltage node.

24. The switched-transconductance circuit as claimed in claim 23, wherein:
the at least one input node includes a pair of input nodes to receive a differential input voltage thereacross,
the at least one output node includes a pair of output nodes to provide a differential output current therebetween that is proportional to the differential input voltage, and
the transconductance element produces the differential output current such that the differential output current is negligible when a negligible differential voltage is applied across the pair of input nodes.

25. The switched-transconductance circuit as claimed in claim 23, wherein the transconductance stage is arranged such that a control signal that controls the at least one biasing device also controls the switch.

26. A transconductance circuit, comprising:
a differential pair of input transistors having respective current electrodes coupled to a common node,
at least one input node coupled to one of the differential pair of input transistors to receive an input voltage thereon;
a pair of circuit nodes coupled to the differential pair of input transistors to provide an output current therebetween having an amplitude that is proportional to an amplitude of the input voltage;
at least one biasing device to selectively provide a biasing current that drives the differential pair of input transistors, the at least one biasing device being in an off state when the differential pair of input transistors is not being driven by the biasing current; and a first pair of switches, each of the first pair of switches being coupled between a respective one of the pair of circuit nodes and a constant voltage node such that activation of each of the first pair of switches causes a respective one of the pair of circuit nodes to be coupled to the constant voltage node.

27. The transconductance circuit as claimed in claim 26, wherein each of the first pair of switches is activated only when the differential pair of input transistors is not being driven by the biasing current.

28. A switched-transconductance circuit, comprising:
at least one transconductance stage including:
at least one input node to receive an input voltage;
at least one output node to provide an output voltage that is proportional to the input voltage;
a transconductance element that receives the input voltage from the at least one input node and, when enabled, provides the output current to at least one circuit node of the transconductance element;
enabling means for selectively enabling the transconductance element, the enabling means being in an off state when the transconductance element is not enabled;
first means for selectively coupling the at least one circuit node to the at least one output node to permit the output current to flow therebetween; and
second means for selectively coupling the at least one circuit node to a constant voltage node when the at least one circuit node is not coupled to the at least one output node.

29. A switched-transconductance circuit, comprising:
at least one transconductance stage, which is powered from a voltage provided between a first supply node and a second supply node, including:
a differential pair of input transistors having respective current electrodes coupled to a common node,
at least one input node coupled to one of the differential pair of input transistors to receive an input voltage thereon;
at least one output node coupled to one of the differential pair of input transistors to provide an output current having an amplitude that is proportional to an amplitude of the input voltage;
means, coupled to each of the common node and the first supply node, for selectively enabling the at least one transconductance stage, the enabling means being in an off state when the at least one transconductance stage is not enabled; and
means for selectively coupling the common node to a constant voltage node other than the first supply node when the at least one transconductance stage is not enabled.

30. A transconductance circuit, comprising:
at least one input node to receive an input voltage thereon;
at least one output node to provide an output current having an amplitude that is proportional to an amplitude of the input voltage; and
at least one switch coupled between the at least one output node and a constant voltage node such that activation of the at least one switch causes the at least one output node to be coupled to the constant voltage node, the at least one switch being activated in a manner that does not require any transistors to saturate.

31. A method for improving isolation of a switched-transconductance circuit, comprising the steps of:

providing at least one transconductance element that receives an input voltage, receives a biasing current to enable the transconductance element and, when enabled, provides an output current having an amplitude that is proportional to an amplitude of the input voltage to at least one circuit node of the transconductance element;
using at least one biasing device to selectively generate the biasing current, the at least one biasing device being in an off state when the transconductance element is not enabled;
when the transconductance element is not enabled, coupling the at least one circuit node to a constant voltage node and uncoupling the at least one circuit node from at least one output node of the switched-transconductance circuit; and
when the transconductance element is enabled, coupling the at least one circuit node to the at least one output node of the switched-transconductance circuit and uncoupling the at least one circuit node from the constant voltage node.

32. A method for improving isolation of a switched-transconductance circuit, comprising the steps of:
providing at least one transconductance stage, which is powered from a voltage provided between a first supply node and a second supply node, including a differential pair of input transistors having respective current electrodes coupled to a common node, at least one input node coupled to one of the differential pair of input transistors to receive an input voltage thereon, at least one output node coupled to one of the differential pair of input transistors to provide an output current having an amplitude that is proportional to an amplitude of the input voltage, and at least one biasing device, coupled to each of the common node and the first supply node, to selectively provide a biasing a current to the at least one transconductance stage that at least partially enables the at least one transconductance stage, the at least one biasing device being in an off state when the at least one transconductance stage is not enabled;
when the at least one transconductance stage is not enabled, coupling the common node to a constant voltage node other than the first supply node; and
when the at least one transconductance stage is enabled, uncoupling the common node from the constant voltage node.

33. The switched-transconductance circuit as claimed in claim 2, wherein the at least one second switch is activated only when the transconductance element is not enabled.

34. The switched-transconductance circuit as claimed in claim 1, wherein the at least one second switch is activated only when the transconductance element is not enabled.

35. The switched-transconductance circuit as claimed in claim 1, wherein the at least one first switch is activated whenever the at least one second switch is not activated.

36. The switched-transconductance circuit as claimed in claim 1, wherein the at least one second switch is coupled between the at least one circuit node and the constant voltage node such that, when the at least one second switch is activated, current is permitted to flow between the at least one circuit node and the constant voltage node.

37. The switched-transconductance circuit as claimed in claim 36, wherein the at least one first switch is coupled between the at least one circuit node and the at least one output node such that, when the at least one first switch is activated, current is permitted to flow between the at least one circuit node and the at least one output node.

38. The switched-transconductance circuit as claimed in claim 1, wherein the at least one first switch is coupled between the at least one circuit node and the at least one output node such that, when the at least one first switch is activated, current is permitted to flow between the at least one circuit node and the at least one output node.

39. The transconductance circuit as claimed in claim 26, further including a second pair of switches, each of the second pair of switches being coupled between a respective one of the pair of circuit nodes and a respective one of a pair of output nodes of the transconductance circuit such that activation of each of the second pair of switches causes the respective one of the pair of circuit nodes to be coupled to the respective one of the pair of output nodes.

* * * * *